United States Patent
Val

(10) Patent No.: US 8,546,190 B2
(45) Date of Patent: Oct. 1, 2013

(54) METHOD FOR POSITIONING CHIPS DURING THE PRODUCTION OF A RECONSTITUTED WAFER

(75) Inventor: Christian Val, St Remy les Chevreuse (FR)

(73) Assignee: 3D Plus, Buc Cedex (FR)

(*) Notice: Subject to any disclaimer, the term of this patent is extended or adjusted under 35 U.S.C. 154(b) by 0 days.

(21) Appl. No.: 13/255,874

(22) PCT Filed: Mar. 9, 2010

(86) PCT No.: PCT/EP2010/052964
§ 371 (c)(1), (2), (4) Date: Sep. 9, 2011

(87) PCT Pub. No.: WO2010/102996
PCT Pub. Date: Sep. 16, 2010

(65) Prior Publication Data
US 2011/0312132 A1    Dec. 22, 2011

(30) Foreign Application Priority Data
Mar. 10, 2009  (FR) ..................... 09 01095

(51) Int. Cl.
*H01L 21/00* (2006.01)

(52) U.S. Cl.
USPC ........... 438/118; 438/106; 438/107; 438/112; 438/126; 257/678; 257/E25.014

(58) Field of Classification Search
USPC ............................. 438/106–127
See application file for complete search history.

(56) References Cited

U.S. PATENT DOCUMENTS

| | | | |
|---|---|---|---|
| 4,216,444 A | 8/1980 | Vergnolle et al. | |
| 4,408,256 A | 10/1983 | Val | |
| 4,413,170 A | 11/1983 | Val et al. | |
| 4,518,818 A | 5/1985 | Le Ny et al. | |
| 4,546,028 A | 10/1985 | Val | |
| 4,553,020 A | 11/1985 | Val | |
| 4,559,579 A | 12/1985 | Val | |
| 4,639,826 A | 1/1987 | Val et al. | |
| 4,654,694 A | 3/1987 | Val | |

(Continued)

FOREIGN PATENT DOCUMENTS
| | | |
|---|---|---|
| DE | 10250621 A1 | 5/2004 |
| WO | 02/15266 A2 | 2/2002 |

OTHER PUBLICATIONS

D. Lammers: "Freescale Taking Redistributed Chip Packaging to Pilot Production Stage," News Editor, Semiconductor International, May 12, 2008.

(Continued)

*Primary Examiner* — Seavosh Nikmanesh
*Assistant Examiner* — Evren Seven
(74) *Attorney, Agent, or Firm* — Baker & Hostetler LLP

(57) ABSTRACT

A process for fabricating a reconstituted wafer that includes chips having connection pads on a front side of the chip, this process including positioning of the chips on an adhesive support, front side down on the support; deposition of a resin on the support in order to encapsulate the chips; and curing of the resin. Before deposition of the resin, the process includes bonding, onto the chips, a support wafer for positioning the chips, this support wafer having parts placed on one side of the chips.

13 Claims, 8 Drawing Sheets

(56) References Cited

U.S. PATENT DOCUMENTS

| | | | |
|---|---|---|---|
| 4,755,910 A | 7/1988 | Val | |
| 5,002,895 A | 3/1991 | Le Parquier et al. | |
| 5,237,204 A | 8/1993 | Val | |
| 5,323,533 A | 6/1994 | Val | |
| 5,400,218 A | 3/1995 | Val | |
| 5,461,545 A | 10/1995 | Leroy et al. | |
| 5,526,230 A | 6/1996 | Val | |
| 5,637,536 A | 6/1997 | Val | |
| 5,640,760 A | 6/1997 | Val et al. | |
| 5,847,448 A | 12/1998 | Val et al. | |
| 5,885,850 A | 3/1999 | Val | |
| 5,960,260 A * | 9/1999 | Umehara et al. | 438/118 |
| 6,107,163 A * | 8/2000 | Kojima et al. | 438/464 |
| 6,214,733 B1 * | 4/2001 | Sickmiller | 438/691 |
| 6,271,469 B1 * | 8/2001 | Ma et al. | 174/521 |
| 6,307,261 B1 | 10/2001 | Val et al. | |
| 6,458,626 B1 * | 10/2002 | Huang et al. | 438/112 |
| 6,608,391 B1 | 8/2003 | Wu | |
| 6,716,672 B2 | 4/2004 | Val | |
| 6,809,367 B2 | 10/2004 | Val | |
| 7,011,989 B2 * | 3/2006 | Becker et al. | 438/113 |
| 7,033,857 B2 * | 4/2006 | Munakata et al. | 438/106 |
| 7,329,564 B2 * | 2/2008 | Nakamura et al. | 438/113 |
| 7,384,820 B2 * | 6/2008 | Munakata et al. | 438/113 |
| 7,476,965 B2 | 1/2009 | Val et al. | |
| 7,579,216 B2 * | 8/2009 | Munakata et al. | 438/113 |
| 7,635,639 B2 | 12/2009 | Val et al. | |
| 7,682,858 B2 * | 3/2010 | Nagai et al. | 438/33 |
| 7,816,185 B2 * | 10/2010 | Munakata et al. | 438/113 |
| 7,877,874 B2 | 2/2011 | Val | |
| 7,910,459 B2 * | 3/2011 | Nakamura | 438/463 |
| 7,951,649 B2 | 5/2011 | Val | |
| 2008/0170374 A1 | 7/2008 | Val | |
| 2008/0316727 A1 | 12/2008 | Val et al. | |
| 2009/0260228 A1 | 10/2009 | Val | |
| 2010/0276081 A1 | 11/2010 | Val | |
| 2011/0247210 A1 | 10/2011 | Val et al. | |

OTHER PUBLICATIONS

Freescale Semiconductor, Inc.: "RCP Process, How it works," 2007.
C. Val: "Eureka Pidea Cluster Walpack."

* cited by examiner

METHOD FOR POSITIONING CHIPS DURING THE PRODUCTION OF A RECONSTITUTED WAFER

CROSS-REFERENCE TO RELATED APPLICATIONS

This application is a National Stage of International patent application PCT/EP2010/052964, filed on Mar. 9, 2010, which claims priority to foreign French patent application No. FR 09 01095, filed on Mar. 10, 2009, the disclosures of each of which are incorporated by reference in their entireties.

FIELD OF THE INVENTION

The field of the invention is that of the fabrication of reconstituted wafers comprising chips encapsulated in a resin, these chips generally having been tested beforehand.

BACKGROUND OF THE INVENTION

The solution most commonly employed for producing a reconstituted wafer consists in removing various types of chips or dies that are generally selected after having been tested and usually designated as "known good dies". The term "chip" denotes an active electronic component, such as a bare chip, or a passive component or an MEMS (MicroElectroMechanical System). As shown in FIG. 1, these chips 10, which have connection pads 11 on a side called the active side or front side 12, are then positioned front side down on an adhesive support 20, for example by means of a pick-and-place machine. This adhesive support 20 is typically an adhesive skin 21 itself bonded to a rigid support 22. Next, the chips are encapsulated in a polymer resin of the epoxy type so as to firmly secure them. A redistribution layer or RDL is then formed, possibly in several stages, on the front side after the rigid support 22 and the adhesive skin 21 have been removed. This RDL layer, which includes tracks made for example of TiW/Cu or TiPd/Au, is formed on a dielectric layer deposited instead of the adhesive support, by dip coating or spin coating. The wafer thus reconstituted, which does not contain defective chips, can then be diced in order to obtain plastic micropackages. The wafer can also be stacked on other reconstituted wafers and electrically connected to these wafers using various known methods, the stack then being diced in order to obtain 3D (three-dimensional) electronic modules.

The encapsulation of the chips comprises:
a step of depositing the resin (by casting or by compression molding) around and possibly on the chips bonded to the adhesive support, so as to fill the inter-chip spaces; and
a step of curing the resin, thus forming a rigid handleable substrate in which the chips are fixed, the adhesive substrate then being able to be removed.

One obvious drawback is the movement of the chips while the resin is being deposited and/or while it is curing. This is because the irreversible shrinkage and the reversible expansion of the resin after curing create relatively isotropic and predictable micromovements of the chips. These micromovements are typically between a few μm and a few tens of μm, thus possibly exceeding the required post-molding positioning tolerances that are typically of the order of 10 μm.

One solution that has been proposed consists in placing a copper rectangular-mesh lattice on the adhesive support and then in transferring the chips onto the support in the cavities located between the intersecting bars of the lattice. This lattice is thus used as a template in which the chips are placed. The resin is then deposited between the bars and then cured.

This method helps to reduce the expansion, and therefore the movement of the chips, but does not enable it to be eliminated. It also has the following drawbacks:
the lattice necessarily remains in the final package, since once molded in the resin it can no longer be removed;
this limits the number of chips on the wafer because of the space taken up by the lattice; and
this requires a double dicing operation so as to make the bars of the lattice disappear.

SUMMARY OF THE INVENTION

The object of the invention is to alleviate this drawback of the chips moving while they are being molded in resin.

More precisely, the subject of the invention is a process for fabricating a reconstituted wafer that includes chips having connection pads on one side of the chip, called the front side, this process comprising the following steps:
positioning of the chips on an adhesive support, front side down on the support;
deposition of a resin on the support in order to encapsulate the chips; and
curing of the resin.

The process is mainly characterized in that before the resin deposition step, the process includes a step of bonding, onto the chips, a support wafer for positioning the chips, this support wafer having parts placed on one side of the chips.

This process makes it possible to keep the chips at the place where they have been positioned, while they are being molded in the resin and thereafter.

Since the material of the chips has an expansion coefficient of about 3 ppm/° C., the material of the support wafer advantageously has an expansion coefficient close to that of the chips, i.e. less than 10 ppm/° C.

The support wafer is in general completely or partially metallic.

The support wafer may be a solid wafer or a lattice that has openings.

According to one feature of the invention, the process includes, after the curing step, a step of completely or partially removing the support wafer.

This support wafer may also help to solve the thermal problem of the heat output by the chips during operation. This problem is even more sensitive in 3D electronic modules in which chips are stacked.

For this purpose, according to another feature of the invention, parts of the support wafer, which are bonded to the chips, are furthermore heat sink elements that will thus dissipate the heat emitted by the chips and also uniformly spread the heat from the chips so as to avoid hotspots that would impair their reliability.

According to a first embodiment, the support wafer is a lattice bonded to the back sides of the chips.

In this case, the bonding of the lattice to the chips comprises for example a step of depositing a polymer adhesive on the back sides of the chips, a step of positioning the lattice so as to position elements of the lattice on the adhesive, and then a step of curing the adhesive.

The lattice may have two parts, a first part forming a lattice, and pillars forming a second part, these pillars passing through the first part.

This first part of the lattice may be made of ceramic, for example glass, alumina or aluminum nitride.

According to a second embodiment, the support wafer is bonded to the front side of the chips.

In this case, the bonding of the support wafer to the chips comprises for example a step of depositing a film of adhesive on the support wafer, a step of positioning the chips on this film, so as to bond the front sides of the chips to the support wafer, a step of curing the film of adhesive and it possibly includes a step of completely or partly removing the support wafer after the resin has cured.

The adhesive is preferably cured at a temperature below 100° C. and/or by ultraviolet and/or microwave radiation.

BRIEF DESCRIPTION OF THE DRAWINGS

Other features and advantages of the invention will become apparent on reading the following detailed description, given by way of nonlimiting example and with reference to the appended drawings in which:

FIGS. 4a to 4e show schematically a wafer during various fabrication steps according to the invention, with a lattice having pillars, bonded to the back sides of the chips, it being possible for the resin to extend even more beyond the level of the chips than in the case of FIGS. 3a to 3c, the wafer being seen in cross section, while FIG. 4e shows other shapes of the pillars in cross section;

From one figure to another, the same elements are identified by the same references. The reference 1 denotes the reconstituted wafer during the various steps of its fabrication.

DETAILED DESCRIPTION

The process according to the invention is based on the use of a support wafer. Unlike the lattice of the prior art, the support wafer is bonded to the chips on the back side or, according to a variant, on the front side.

The support wafer may be made of copper or aluminum, these materials having an expansion coefficient of between 15 and 25 ppm/° C.

Preferably, the material of the support wafer has an expansion coefficient close to that of the chips (in fact that of the main material of the chips) so as to expand approximately in the same way while the resin is curing, thus maintaining the positions prior to curing. Silicon, which is typically the material of the chips, has an expansion coefficient of about 3 to 4 ppm/° C. A support wafer made of a material having an expansion coefficient of less than 10 ppm/° C., such as ferronickel, would be preferably suitable. A support wafer made of silicon may also be envisaged.

The generally metallic support wafer may be a solid wafer or a lattice having openings 44.

Figure 1:
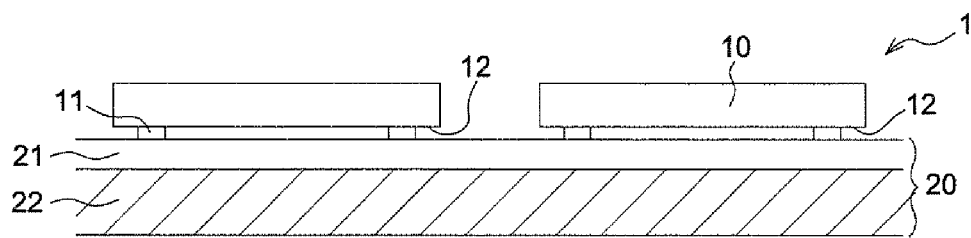
FIG. 1, already described, shows schematically a reconstituted wafer during fabrication, the wafer being seen in cross section.
Figure 2A:
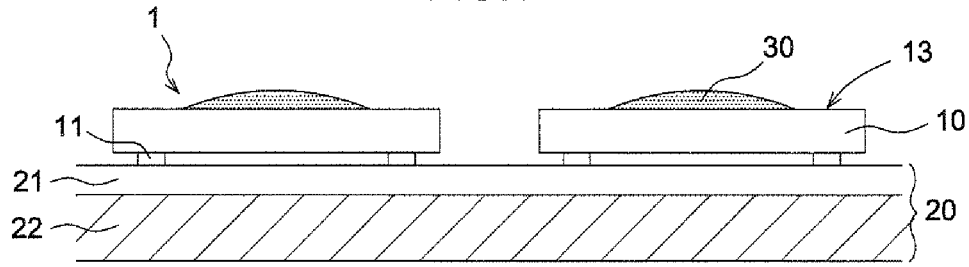
FIGS. 2a to 2f show schematically a wafer during various fabrication steps according to the invention, with a lattice bonded to the back sides of the chips and the resin not extending above the level of the chips, the wafer being seen in cross section except in the case of FIG. 2c, which is a top view.
Figure 2B:
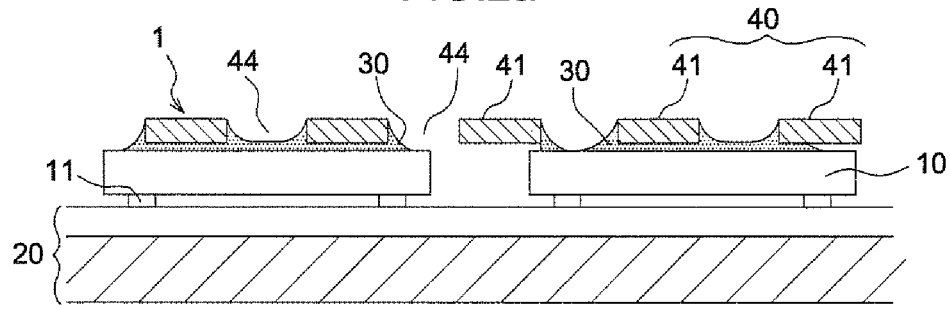
Figure 2C:
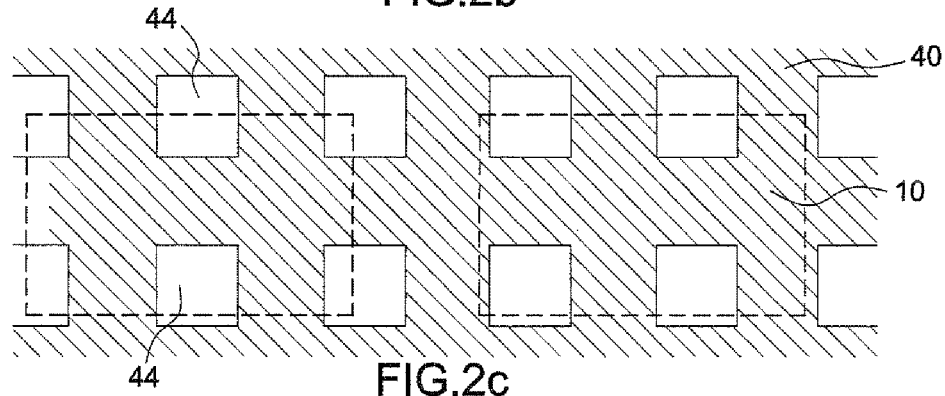
Figure 2D:
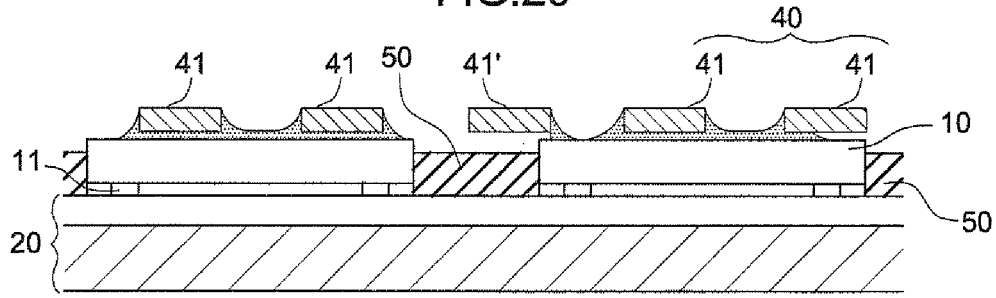
Figure 2E:
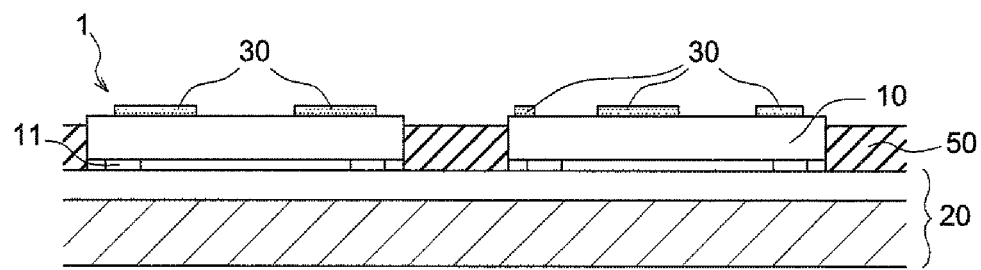

This lattice has for example rectangular mesh openings 44, as may be seen in FIG. 2c. Other mesh arrangements are conceivable and these will be described later.

The bars of the lattice, or more generally its various elements, preferably have a rectangular cross section or one such that at least the side turned toward the chips is planar, as appears in cross section in the figures.

The metal lattice is for example obtained by photoetching or by stamping, and is produced before being bonded to the chips.

According to a first method of implementation described in relation to FIGS. 2a to 2e, the support lattice 40 for positioning the chips is bonded to the back sides 13 of the chips, the back side being of course on the opposite side from the front side. This step takes place after the chips 10 have been positioned on the adhesive support 20 and of course before the resin is deposited.

This step comprises a first substep in which the polymer adhesive 30, for example an epoxy adhesive, is deposited on the back side 13 of the chips, as shown in FIG. 2a. This adhesive may be deposited by syringe or by inkjet printing or by screen printing or by stencil spraying or by any other means known to those skilled in the art. The lattice 40 is deposited on the chips during a second substep, shown in FIGS. 2b and 2c, and finally a third substep, for curing this adhesive, is carried out at low temperature, i.e. at a temperature below 100° C., or close to room temperature, for example by UV or microwave curing. The bonding force of this cured adhesive is much higher than that of the adhesive skin, which may be roughly likened to "Scotch" adhesive tape. Each chip 10 is thus bonded to at least one bar 41 of the lattice, as illustrated in cross section in FIG. 2c and seen from above in FIG. 2d. Certain bars 41' may possibly be partly or completely outside the chips 10, as in the example shown in FIG. 2d, this depending on the pitch of the lattice mesh and on that of the chip positioning.

The resin 50 is then deposited between the chips 10 (FIG. 2d) without reaching the level of the lattice 40, using a conventional pouring method such as by means of an automatic syringe, thereby enabling the resin to flow through the lattice since it is by construction apertured. The resin is then cured in a known manner.

Figure 2F:
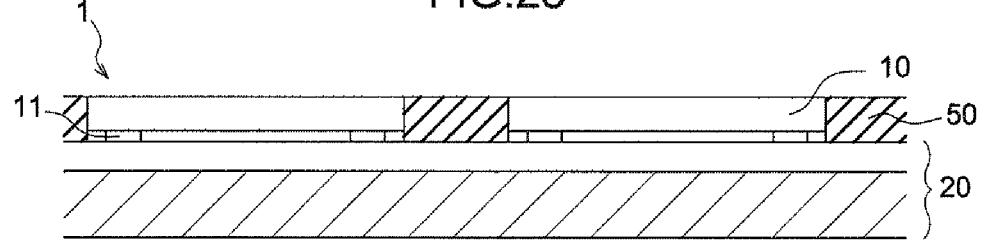

The metal lattice 40 is then removed, for example by dissolving it in a conventional solution of the ferric chloride type. Spots of adhesive, visible in FIG. 2e, remain on the chips. These spots of adhesive themselves are removed for example during a chip thinning operation by chemical etching or by polishing. The result is shown in FIG. 2f.

Figure 3A:
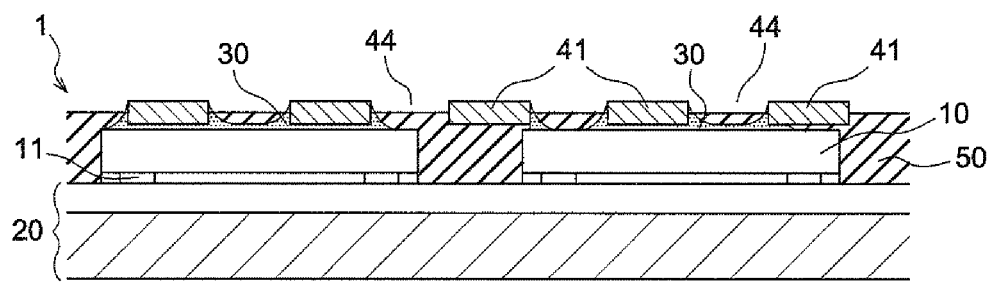
FIGS. 3a to 3c show schematically a wafer during various fabrication steps according to the invention, with a lattice bonded to the back sides of the chips and the resin extending above the level of the chips, but without embedding the lattice, the wafer being seen in cross section.
Figure 3B:
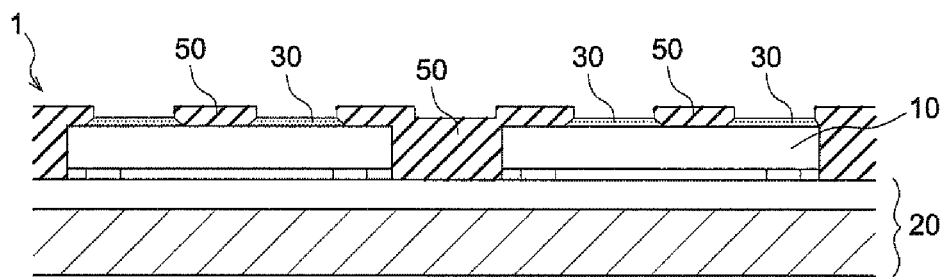
Figure 3C:
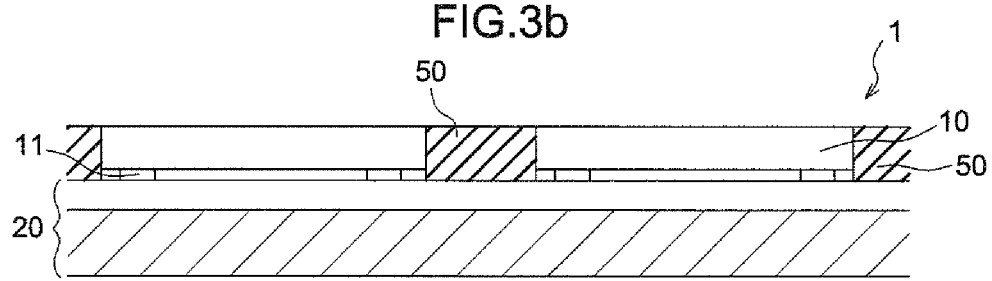

According to a variant, the resin 50 is deposited so as to reach the lattice 40 (or the bars 41 of the lattice) as shown in FIG. 3a, but without however embedding the lattice, which then would be difficult to dissolve. Upon removal of the lattice, there remain on the back side of the chips 10 not only spots of adhesive 30 but residual resin 50, as may be seen in FIG. 3b. The adhesive 30 and resin 50 are removed for example by polishing and then chemically etching the wafer 1 on the back side of the chips. The result is shown in FIG. 3c.

Figure 4A:
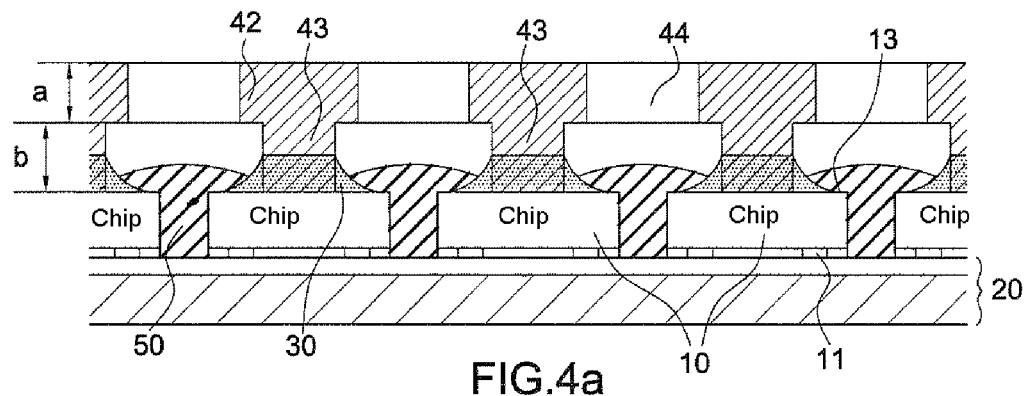

According to another variant described in relation to FIGS. 4a to 4e, the lattice comprises a lattice-forming first part 42 and pillars 43 forming a second part, which pass through this first part and are intended to make the first part 42 be slightly away (by a distance b) from the plane of the chips so as to be able to deposit a layer of resin 50 having a greater thickness than that of the chips 10, without however the first part 42 of the lattice being embedded in this layer of resin. The thickness is measured in the direction perpendicular to the plane of the wafer. These pillars 43, an example of which is given in FIG. 4*a*, are bonded via their bases to the chips 10. The layer of resin 50 thus fills the inter-chip spaces and covers the back sides 13 of the chips away from the pillars. These pillars have a thickness b typically between 100 μm and 1000 μm. Thus, the back sides of the chips may be covered with a layer of resin for example 50 μm to 300 μm in thickness. The pillars 43 have for example, at their base, a diameter of 2000 μm for a chip back side measuring about 4000 μm×4000 μm.

Figure 4B:
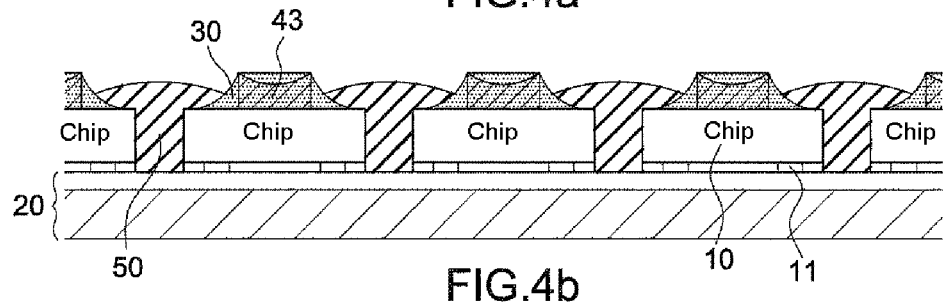
Figure 4C:
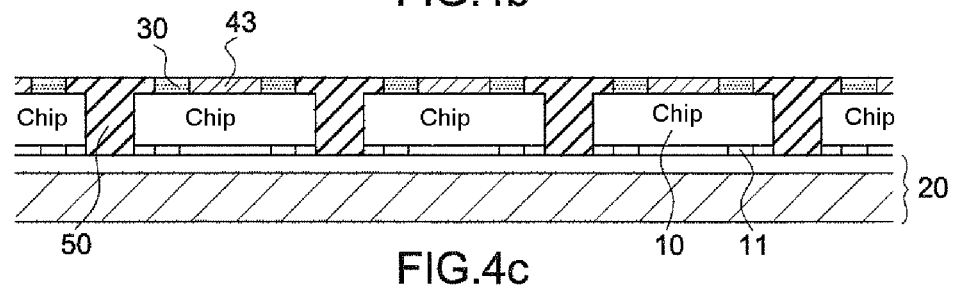

Various pillar shapes may be envisaged. In FIG. 4*e*, the diameter of the "top" part 43*a* of the pillar, fixed in the first part 42 of the lattice, is smaller than that of the base 43*b* of the pillars, which will be bonded to the back sides of the chips. This approach has the advantage of strengthening the first part 42 of the lattice, which thus comprises more material.

These pillars 43 may be made of the same material as the first part 42 of the lattice, as in the example shown in FIG. 4*a*, and produced at the same time, for example by selective photoetching. After the resin has cured, the first part of the lattice and the pillars are removed, for example by chemical etching.

Figure 4D:
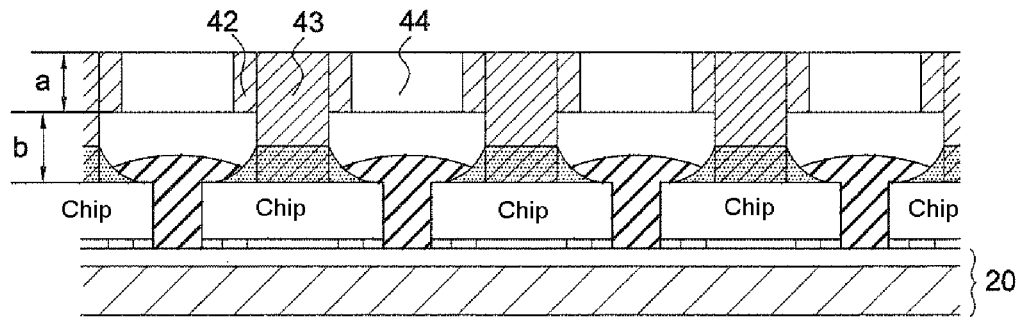
Figure 4E:
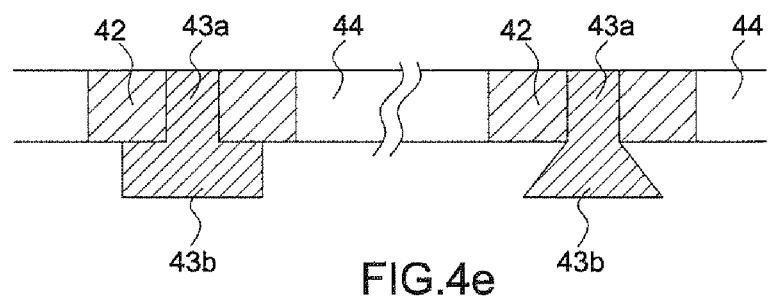

The lattice may also be made of two different materials, one for the pillars 43 and the other for the first part 42, as shown in FIGS. 4*e* and 4*d*. That of the pillars is preferably a soluble material, such as copper or aluminum, which rapidly dissolves in a chemical etching solution if these pillars are intended to disappear. This is the case when it is desired not to increase the final thickness of the wafer 1. In practice, the base of a pillar, which is held by the cured adhesive 30, does not completely disappear when dissolving the pillar, as shown in FIG. 4*b*. A polishing operation serves to planarize the irregular surfaces of the various surplus layers, as may be seen in FIG. 4*b*, or even to reduce their thickness, as may be seen in FIG. 4*c*.

Moreover, the material of the pillars does not necessarily have a low expansion coefficient, since it is the first part of the lattice that controls the expansion. These pillars may be rivets made of copper or aluminum or another metal, riveted to the first part of the lattice. They may also be obtained by localized electrochemical growth of copper, aluminum or another metal on the first part of the lattice.

The material of the first part 42 of the lattice is a material having a low expansion coefficient, close to that of silicon, and is advantageously not chemically etchable in the solution for etching the pillars. Examples of materials that may be mentioned are ferro-nickel, Kovar, Invar or a ceramic (for example, glass, alumina or aluminum nitrate). This part of the lattice (or remainder of the lattice) can thus be reused and may be protected by a nonstick coating of the Teflon type so as to prevent it from adhering to the epoxy resin material.

In the two cases that have just been described, the pillars 43 are removed. In certain cases, it is advantageous not to remove them, since they help to solve the thermal problem of chip heating during operation, which may be considerable, for example whenever chips are stacked. This thermal problem also exists in the mobile telephony field in which hotspots have to be avoided, even if these components are low-power components. The pillars 43 that are left on the chips 10 then act as heat conductors. They also act to spread the heat uniformly over the chips and thus avoid hotspots that would greatly impair their reliability.

It is therefore unnecessary for the material of the pillars to be soluble in a chemical etching solution—it merely has to be a good heat conductor. Aluminum fulfills the first function well, but the second one less well, whereas copper fulfills both these functions. This is because copper, which has a thermal resistance of 360 W/mK, compared to that of an epoxy which is 0.6 W/mK, is a very powerful heat conductor.

The shape of these heat sink elements 45, the pillars 43 of which are one example and another example of which is shown in FIGS. 5*a* to 5*e*, may be adapted, for these heat conduction and uniformization roles to be optimally fulfilled. The pattern of the lattice is determined by the shape, generally rectangular, of the faces of the chips 10 and by the arrangement of the chips on the support, generally in a rectangular grid pattern. In order to adapt to a rectangular grid pattern of chips having rectangular faces, the lattice has for example rectangular mesh cells bounded by bars 46 that will be placed in vertical alignment with the inter-chip spaces after the lattice has been bonded to the chips. The elements 45 of the lattice that are intended to become heat sink elements are also rectangular, with dimensions slightly smaller than those of the faces of the chips, as may be seen in FIG. 5*b*. They are located in the mesh cells so as to be on the back sides of the chips after bonding of the lattice. These elements 45 are fastened to the mesh (in this case to the bars 46) by tabs 47 or feet, preferably four in number, passing in vertical alignment with the corners of the chips so as not to impede the subsequent chip routing, for example when stacking chips. As will be seen later, these tabs 47 also have a heat conduction function. Other lattice shapes may be envisaged in order to be suitable for other shapes of chips and for other arrangements of chips on their support.

The thickness of the heat sink elements is typically between 50 and 200 μm, the overall lattice having the same thickness. According to a variant, the thickness of the tabs 47 and that of the bars 46 is greater than that of the heat sink elements 45 so as to mechanically reinforce the strength of the lattice. A double-thickness lattice is for example obtained by double etching.

When during deposition of the resin between the chips (FIGS. 5*c* and 5*d*) said resin projects beyond and partially covers the heat transfer elements 45 on the surface, overall polishing of the wafer 1 is carried out to remove this surplus of resin.

Figure 5A:
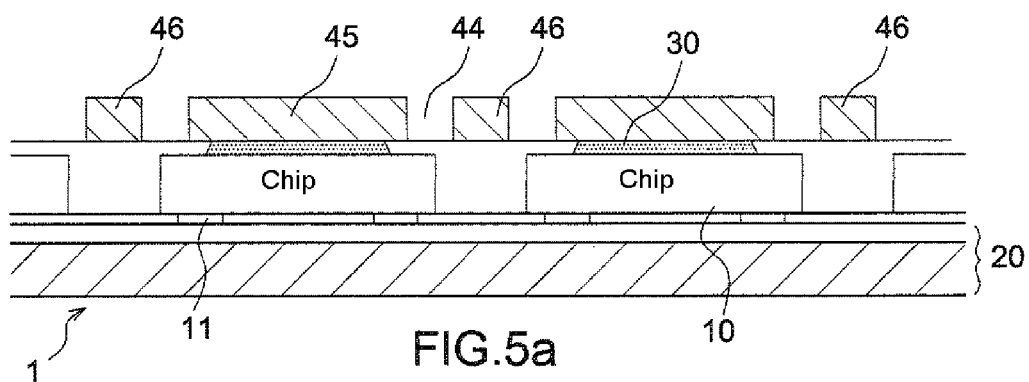
FIGS. 5a to 5e show schematically a wafer during various fabrication steps according to the invention, with a lattice bonded to the back sides of the chips, part of the lattice acting as heat sink elements for the chips and the wafer being seen in cross section, except in the case of FIGS. 5b to 5d, which are top views.
Figure 5B:
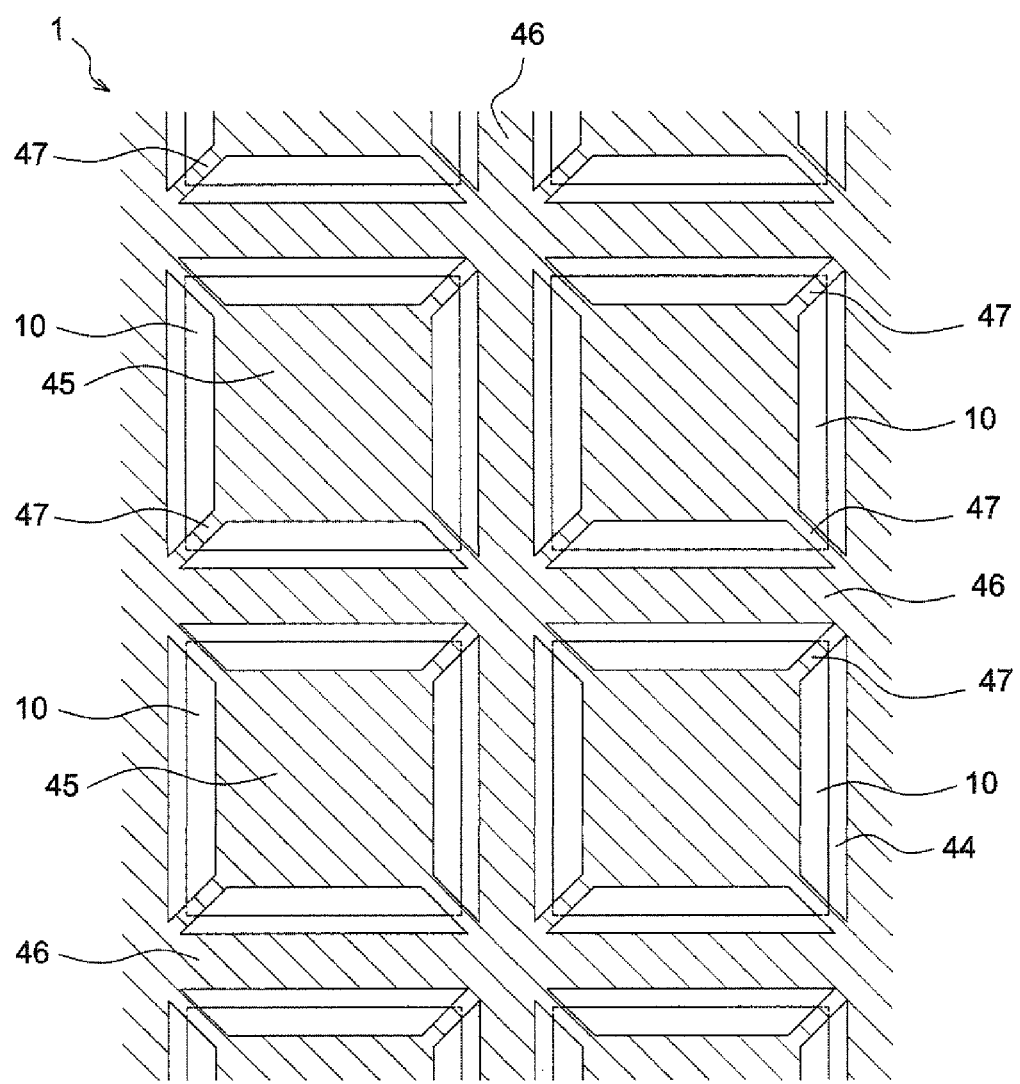
Figure 5C:
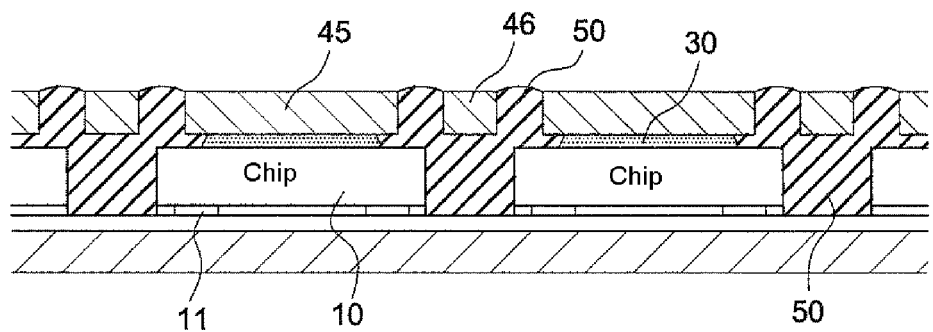
Figure 5D:
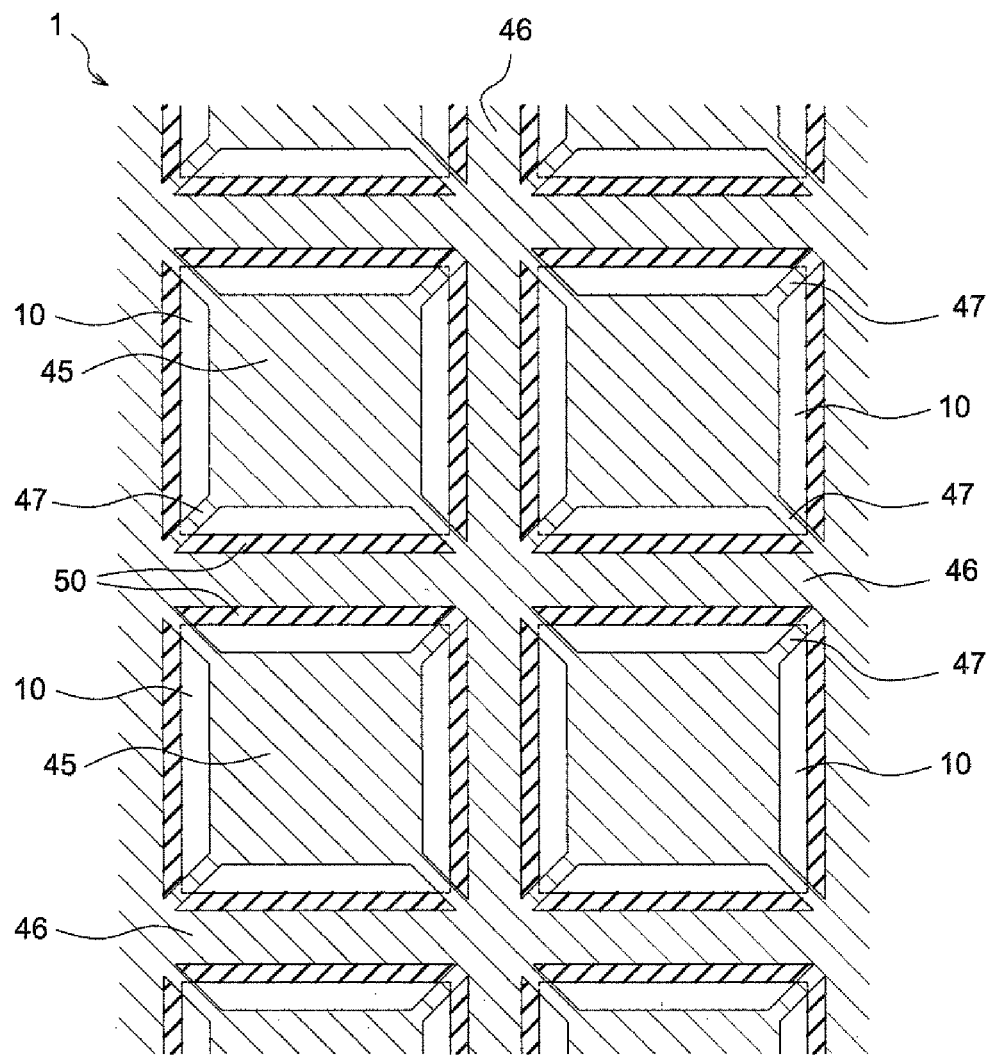
Figure 5E:
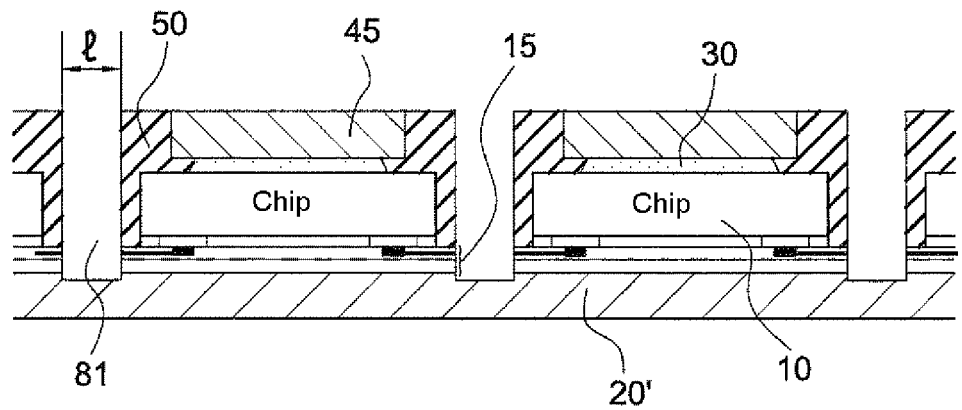

FIG. 5*e* shows the reconstituted wafer 1 after a wafer-scale sawing step, the function of which is:
 to separate the chips 10 from one another; and
 to eliminate the bars 46 of the lattice, the width "I" of the sawing grooves 8 being greater than that of the bars; typically it is between 100 and 200 μm.

Figure 6:
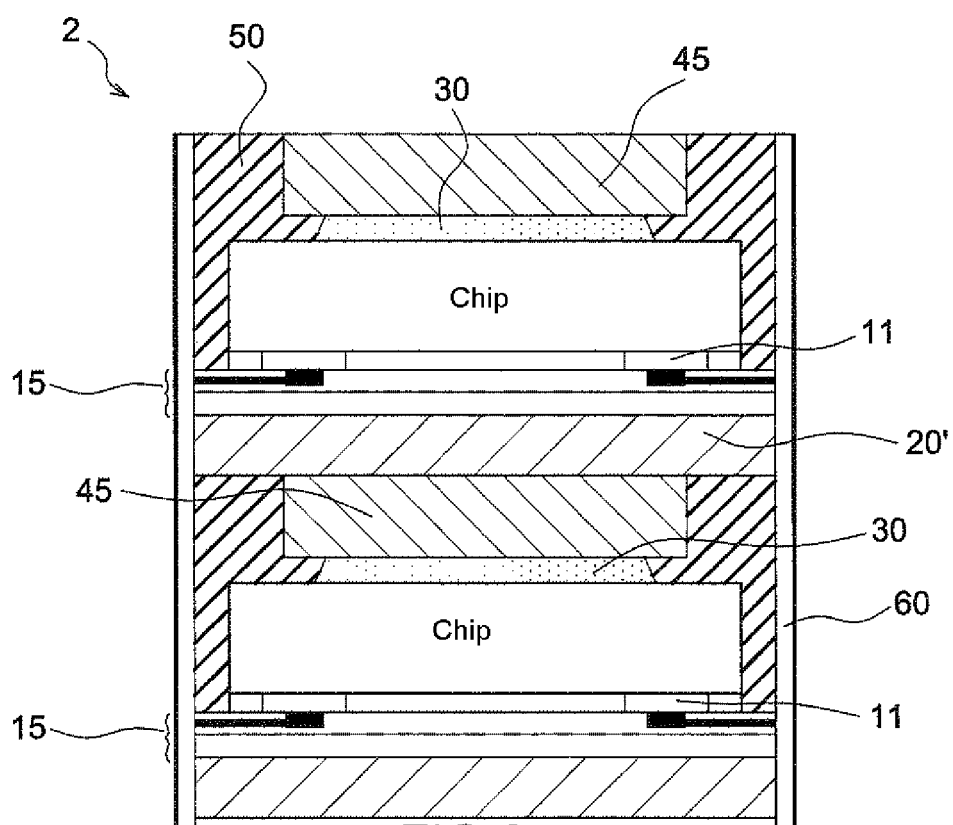
FIG. 6 shows schematically an example of a 3D electronic module comprising a stack of two chips.

A process for the wafer-scale fabrication of 3D electronic modules that includes a stack of chips comprises a step of stacking several reconstituted wafers followed by a step of sawing all the stacked wafers. FIG. 6 shows an example of a 3D module 2 that comprises a stack of two stages of chips 10, the vertical electrical interconnection of which is provided by metallization 60 of the lateral faces of the stack according to a pre-established circuit diagram enabling the various RDL layers 15 to be connected together. These RDL layers 15 are on a rigid adhesive support 20'. The heat sink elements 45 are integrated into the stack. The tabs (not visible in this figure) that emerge on the four corners of the module at each stage are thermally coupled with those above and/or below by lateral metallizations of the 3D module (these being different from the lateral electrical interconnection metallizations), thereby improving thermal contact of the heat sink elements to the outside. If more heat has to be dissipated to the outside, it is possible to reserve one lateral face of the 3D module for this purpose by adjusting the dimensions of the heat sink elements 45 so that one of their sides is flush with this lateral face at each stage, and then metalizing the entire face so as to thermally couple the sides of these elements together. This face of the 3D module therefore will not be used for providing a vertical electrical interconnection function.

Figure 7A:
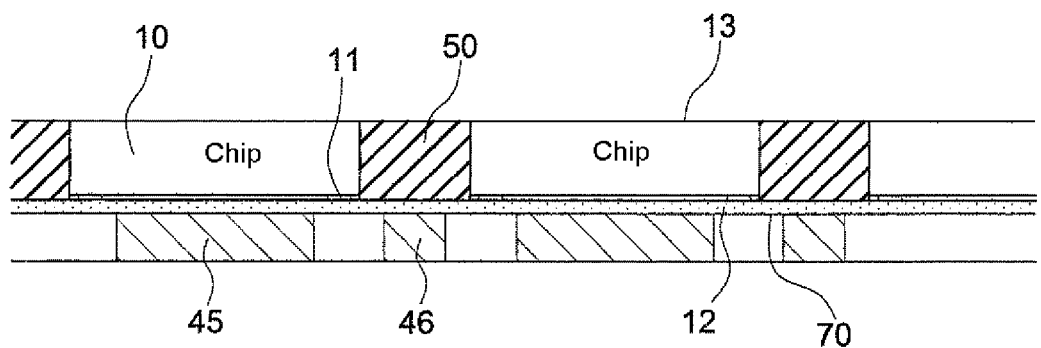
FIGS. 7a to 7e show schematically a wafer during various fabrication steps according to the invention, with a lattice bonded to the front sides of the chips, the wafer being seen in cross section except in the case of FIGS. 7b to 7e, which are top views.

According to a second method of implementing the invention, described in relation to FIGS. 7a to 7e, a lattice 40 is bonded to the front sides 12 of the chips, as shown in FIG. 7a, this being a metal lattice. This method of implementation is for example carried out according to the following steps:

a film of polymer adhesive 70 sufficiently rigid not to fall between the mesh cells of the lattice is deposited on the metal lattice 40 produced beforehand. This is typically a film of an epoxy adhesive or an adhesive film made of a curable polymer;

the chips 10 are transferred onto the film of adhesive 70 and bonded thereto by curing the adhesive (preferably at room temperature, by UV or microwave curing, rather than at a high temperature) so as to keep each of the chips rigidly in position on the lattice before molding of the resin. The transition temperature of the polymer adhesive 70 must be above the curing temperature of the molding resin 50 so as not to lose its properties of keeping each chip in position while the molding resin is curing. In this method of implementation, the lattice 40 also acts as support for the chips, like the support 22 in the preceding examples. For example, it has the shape of the lattice described in relation to FIGS. 2b, 2c and 2d. The film of adhesive 70 has two functions, that of the adhesive support 21 and that of the polymer adhesive 30 between the chips and the lattice of the preceding examples;

the resin 50 is then deposited and cured, so as to mold the chips and form a handleable rigid substrate;

the metal lattice 40 is then removed, for example by dissolving it, as was already seen in the case of the preceding examples;

the film of adhesive 70 is then removed, entirely or partly only to expose the connection pads 11, by chemical dissolution or by laser abrasion or by photoetching or by plasma etching; and the RDL layer, which may comprise several connection layers, is then formed, in a manner known by those skilled in the art, so as to connect the connection pads of the chips to the periphery of the chips.

Figure 7B:
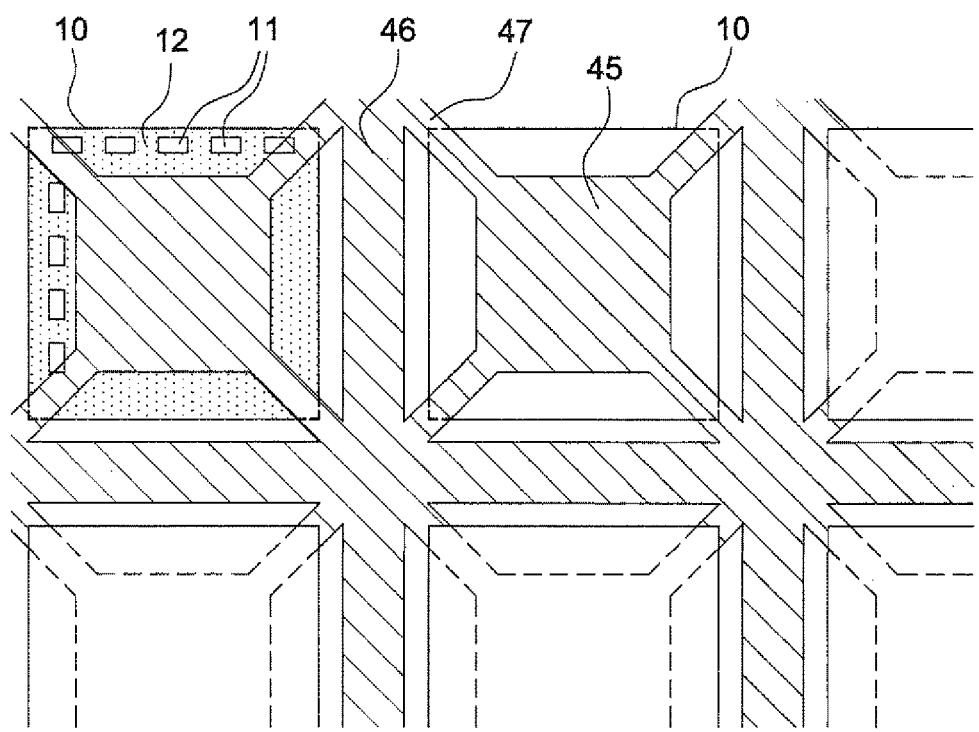
Figure 7C:
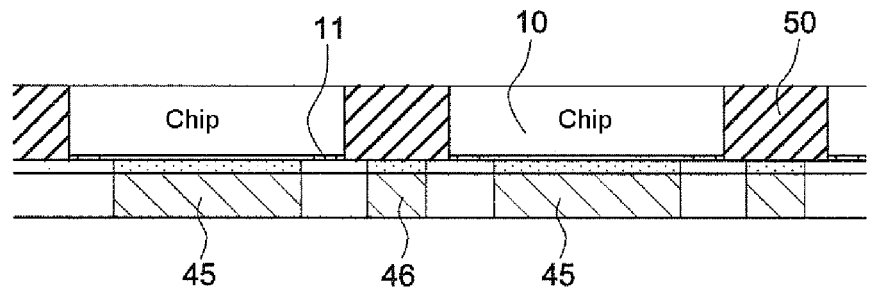

According to a variant shown in FIGS. 7a and 7b, the shape of the lattice is such that no part is in vertical alignment with these pads. In this case, the lattice is not entirely removed. As presented above, parts of the lattice, 45 and 47, are advantageously used as heat sink elements for dissipating the heat. The bars 46 will be removed later when, as already seen, the wafer is being sawn up. A score line is shown in FIG. 7e. The lattice has a shape such as those described in relation to the variants having heat sink elements, such as for example a shape having tabs 47 with, however, a complementary constraint: the dimensions of the heat sink elements 45 must not only be smaller than those of the front sides 13 but must also be smaller than those of the area of the active face 12 bounded by the connection pads 11 of the chip, as may be seen in FIG. 7b. In this way, the shape of the lattice is such that no part is in vertical alignment with these connection pads.

Hitherto, the lattice was produced beforehand, that is to say before being bonded to the chips.

According to a variant of the second method of implementation, there may for example be the following steps:

a film of polymer adhesive is deposited on a solid metal support wafer;

the chips are transferred onto the film of adhesive and bonded by curing the adhesive (preferably at room temperature, by UV or microwave curing, rather than at high temperature) so as to position each of these chips rigidly in place on the support wafer before molding of the resin;

the resin is then deposited and cured in order to mold the chips and form a handleable rigid substrate;

the support wafer is then removed, for example by absorbing it, as already seen in the case of the preceding examples;

the film of adhesive is then removed, entirely or partly, only to expose the connection pads, by chemical dissolution or by laser abrasion or by photoetching or by plasma etching; and the RDL layer, which may comprise several connection layers, is then formed, in a manner known to those skilled in the art, in order to connect the connection pads of the chips to the periphery of the chips.

A reconstituted wafer is therefore produced.

However, if it is desired to keep heat sink elements on the front sides of the chips, this part of the support wafer (corresponding to the heat sink elements) is preserved, but it is necessary to remove at least part of the support wafer which is vertically in alignment with the pads, which part is removed by photoetching. This amounts to producing a lattice in situ.

Removal of the film of adhesive 70 is then a partial removal in order to expose the connection pads 11 of the chips for the purpose of connecting them to the RDL layer, as indicated above.

Figure 7D:
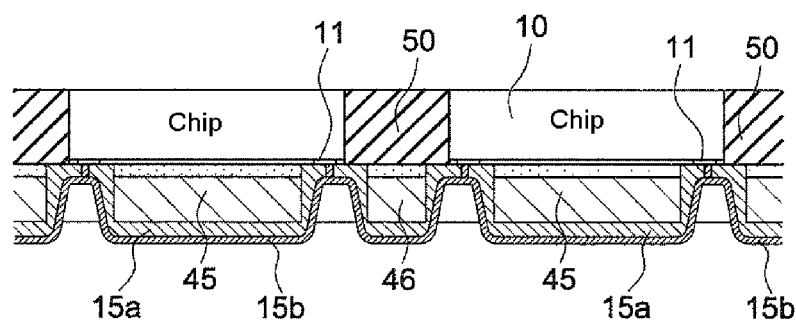
Figure 7E:
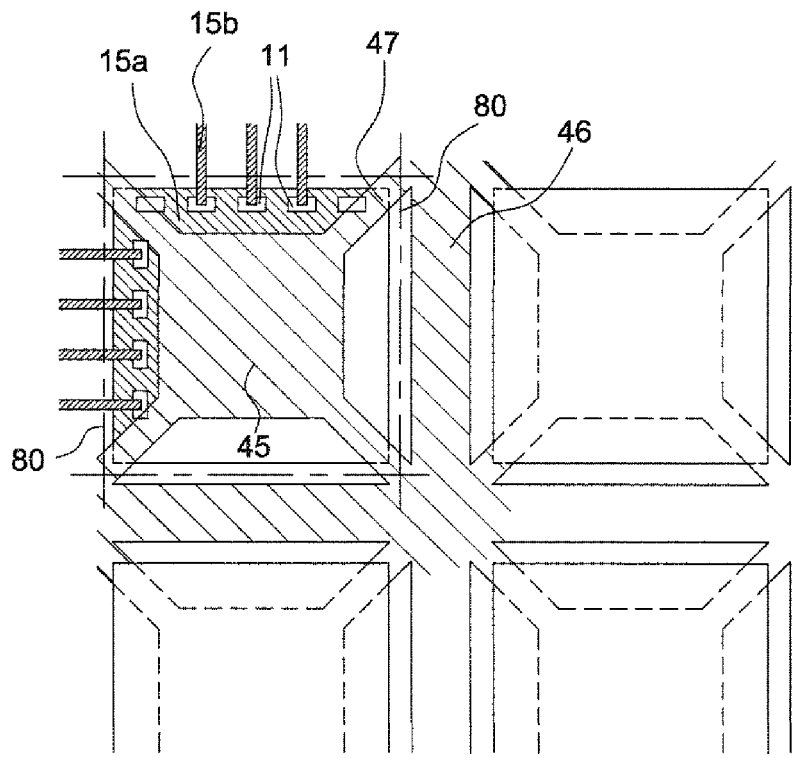

The step of constructing the RDL layer is then carried out by depositing a layer of dielectric 15a, for example by photoetching, followed by deposition of TiPd/Au or TiW/Cu tracks 15b, as illustrated in FIGS. 7d and 7e. This is more difficult than in the preceding case owing to the fact that it has to be constructed on a nonplanar surface.

The invention claimed is:

1. A process for fabricating a reconstituted wafer that includes chips having connection pads on a front side of a chip, the process comprising:

positioning of the chips on an adhesive support, front side down on the adhesive support;

deposition of a resin on the adhesive support in order to encapsulate the chips; and curing of the resin, wherein before the deposition of the resin, bonding, onto the chips, a support wafer for positioning the chips, the support wafer having parts placed on a back side of the chips, wherein the support wafer is a lattice bonded to back sides of the chips, wherein the lattice comprises a first part forming a lattice, and pillars forming a second part, these pillars passing through the first part; and after curing the resin, completely or partially removing the support wafer.

2. The process for fabricating a reconstituted wafer according to claim 1, wherein a main material of the chips has an expansion coefficient of about 3 ppm/° C., and a material of the support wafer has an expansion coefficient of less than 10 ppm/° C.

3. The process for fabricating a reconstituted wafer according to claim 1, wherein the support wafer is completely or partially metallic.

4. The process for fabricating a reconstituted wafer according to claim 3, wherein the metallic part of the support wafer comprises copper, nickel, aluminum, a ferro-nickel alloy, a Kovar alloy, or an Invar alloy.

5. The process for fabricating a reconstituted wafer according to claim 1, wherein the support wafer has a thickness of between 100 and 500 μm, this thickness being considered in the direction perpendicular to the plane of the reconstituted wafer.

6. The process for fabricating a reconstituted wafer according to claim 1, wherein the support wafer is a solid wafer or the lattice that has openings.

7. The process for fabricating a reconstituted wafer according to claim 1, wherein the support wafer is a stamped or photoetched metal lattice.

8. The process for fabricating a reconstituted wafer according to claim 1, wherein the bonding of the lattice to the chips comprises depositing a polymer adhesive on the back sides of the chips, positioning the lattice so as to position elements of the lattice on the adhesive, and then curing the adhesive.

9. The process for fabricating a reconstituted wafer according to claim 1, wherein one part of the pillars remains bonded to the chips after the lattice removal step.

10. The process for fabricating a reconstituted wafer according to claim 1, wherein the first part of the lattice comprises a ceramic.

11. The process for fabricating a reconstituted wafer according to claim 10, characterized in that wherein the first part of the lattice comprises glass, alumina, or aluminum nitride.

12. The process for fabricating a reconstituted wafer according to claim 1, wherein the bonding of the support wafer to the chips comprises depositing a film of adhesive on the support wafer, positioning the chips on this film, so as to bond the front sides of the chips to the support wafer, and curing the film of adhesive.

13. The process for fabricating a reconstituted wafer according to claim 1, wherein the adhesive is cured at a temperature below 100° C. and/or by ultraviolet and/or microwave radiation.

* * * * *